United States Patent
Ding et al.

(10) Patent No.: US 10,229,307 B2
(45) Date of Patent: Mar. 12, 2019

(54) DETECTION CIRCUIT, METHOD FOR RECOGNIZING STRUCTURAL FEATURES, AND DISPLAY SUBSTRATE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xiaoliang Ding, Beijing (CN); Xue Dong, Beijing (CN); Haisheng Wang, Beijing (CN); Xiaochuan Chen, Beijing (CN); Yingming Liu, Beijing (CN); Shengji Yang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/568,050

(22) PCT Filed: Mar. 31, 2017

(86) PCT No.: PCT/CN2017/078937
§ 371 (c)(1),
(2) Date: Oct. 20, 2017

(87) PCT Pub. No.: WO2017/215316
PCT Pub. Date: Dec. 21, 2017

(65) Prior Publication Data
US 2018/0218193 A1 Aug. 2, 2018

(30) Foreign Application Priority Data
Jun. 17, 2016 (CN) .......................... 2016 1 0439882

(51) Int. Cl.
*G06K 9/00* (2006.01)
*G06K 9/40* (2006.01)
(Continued)

(52) U.S. Cl.
CPC ............. *G06K 9/0004* (2013.01); *G06K 9/40* (2013.01); *H01L 27/3227* (2013.01);
(Continued)

(58) Field of Classification Search
CPC ................... G06K 9/0004; G06K 9/40; G06K 9/00006–9/0012; H01L 2251/533; H01L 27/3234; H01L 27/14678; G09G 3/00
See application file for complete search history.

(56) References Cited

U.S. PATENT DOCUMENTS 8,160,293 B1 *  4/2012 Fridrich ............. G06K 9/00899
                                                                382/100
9,046,944 B2    6/2015 Ahn
(Continued)

FOREIGN PATENT DOCUMENTS

AU    2002306062 A1    9/2003
AU    2002306062 A8    9/2003
(Continued)

OTHER PUBLICATIONS

First Office Action for Chinese Patent Application No. 201610439882.0 dated May 28, 2018.
(Continued)

*Primary Examiner* — Sean T Motsinger
(74) *Attorney, Agent, or Firm* — Calfee, Halter & Griswold LLP (57) ABSTRACT

The detection circuit for recognizing a feature structure includes a sensing sub-circuit and a processing sub-circuit; the sensing sub-circuit is configured to output a first signal containing only noise information of the sensing sub-circuit
(Continued)

to the processing sub-circuit, and the sensing sub-circuit is also configured to sense the feature structure to obtain a second signal containing information of the feature structure and output a third signal comprising a first signal and a second signal to the processing sub-circuit, and the processing sub-circuit is configured to perform differencing on the first signal and the third signal to output the second signal.

17 Claims, 6 Drawing Sheets

(51) Int. Cl.
    *H01L 27/32*     (2006.01)
    *H01L 27/146*     (2006.01)
    *G09G 3/3208*     (2016.01)

(52) U.S. Cl.
    CPC ....... *H01L 27/3234* (2013.01); *G09G 3/3208* (2013.01); *G09G 2360/144* (2013.01); *H01L 27/14678* (2013.01); *H01L 2251/533* (2013.01)

(56) References Cited

U.S. PATENT DOCUMENTS

| | | | |
|---|---|---|---|
| 2003/0016024 A1* | 1/2003 | Teranuma | G06K 9/0002 324/519 |
| 2005/0024065 A1* | 2/2005 | Umeda | G01D 5/2417 324/663 |
| 2005/0163350 A1 | 7/2005 | Kim et al. | |
| 2005/0200291 A1* | 9/2005 | Naugler, Jr. | G06F 3/0412 315/149 |
| 2007/0285541 A1* | 12/2007 | Nakashiba | G06K 9/0004 348/272 |
| 2009/0154809 A1* | 6/2009 | Fridrich | G06K 9/40 382/181 |
| 2012/0134549 A1* | 5/2012 | Benkley, III | G01N 27/04 382/124 |
| 2012/0313913 A1* | 12/2012 | Shiraki | G06F 3/0412 345/207 |
| 2014/0022188 A1 | 1/2014 | Ahn | |
| 2015/0030217 A1* | 1/2015 | Wickboldt | G06K 9/00026 382/124 |
| 2016/0104422 A1 | 4/2016 | Kishi et al. | |
| 2016/0266695 A1* | 9/2016 | Bae | G06F 1/1643 |
| 2016/0283773 A1* | 9/2016 | Popovich | G02B 26/0808 |
| 2017/0038873 A1 | 2/2017 | Shang et al. | |
| 2017/0289805 A1* | 10/2017 | Hong | G09G 3/3233 |
| 2018/0121703 A1* | 5/2018 | Jung | G06F 3/041 |
| 2018/0196982 A1* | 7/2018 | Panchawagh | G06K 9/00073 |
| 2018/0218193 A1* | 8/2018 | Ding | G06K 9/0004 |

FOREIGN PATENT DOCUMENTS

| | | |
|---|---|---|
| CN | 1831550 A | 9/2006 |
| CN | 203149513 U | 8/2013 |
| CN | 104834406 A | 8/2015 |
| CN | 105046247 A | 11/2015 |
| CN | 105138986 A | 12/2015 |
| CN | 105869554 A | 8/2016 |
| EP | 2687960 A2 | 1/2014 |
| EP | 2687960 A3 | 11/2014 |
| EP | 2687960 B1 | 12/2016 |
| WO | 03077188 A1 | 9/2003 |

OTHER PUBLICATIONS

International Search Report for corresponding PCT patent application No. PCT/CN2017/078937, dated Jul. 6, 2017.

* cited by examiner

In a first sampling stage, the sensing sub-circuit outputs a first signal containing only the noise information of the sensing sub-circuit to the processing sub-circuit — 101

In an exposure stage, the sensing sub-circuit senses the feature structure, to obtain a second signal containing the information of feature structure which is sensed by the sensing sub-circuit — 102

In a second sampling stage, the sensing sub-circuit outputs a third signal, containing the first signal and the second signal, to the processing sub-circuit — 103

In the de-noising stage, the processing sub-circuit performs differencing on the first signal and the third signal to output the second signal — 104

DETECTION CIRCUIT, METHOD FOR RECOGNIZING STRUCTURAL FEATURES, AND DISPLAY SUBSTRATE

CROSS-REFERENCE TO RELATED APPLICATIONS

The present application is based on International Application No. PCT/CN2017/078937, filed on Mar. 31, 2017, which is based upon and claims priority to Chinese Patent Application No. 201610439882.0, titled "detection circuit, method for recognizing structural features, and display substrate", filed Jun. 17, 2016, the entire contents of which are incorporated herein by reference.

TECHNICAL FIELD

The present disclosure relates to the field of information processing technology, and more particularly, to a detection circuit, a method for recognizing structural features, and a display substrate.

BACKGROUND

For some intelligent devices, in the process of feature recognition, generally, a corresponding circuit is used to recognize features. However, due to the process difference of the circuit device and the consistency of the device, the accuracy of the feature recognition is affected by the structure of the circuit itself, which causes that the result of the feature recognition is not accurate and the user experience is affected.

SUMMARY

The objective of the present disclosure is to provide a detection circuit, a method for recognizing structural features, and a display substrate.

In order to solve the above technical problems, the present disclosure provides the following technical solutions.

In a first aspect, the present disclosure provides a detection circuit for recognizing a feature structure to be recognized, comprising a sensing sub-circuit and a processing sub-circuit;

the sensing sub-circuit is configured to output a first signal containing only noise information of the sensing sub-circuit to the processing sub-circuit, and the sensing sub-circuit is also configured to sense the feature structure to obtain a second signal containing information of the feature structure and output a third signal comprising a first signal and a second signal to the processing sub-circuit, and the processing sub-circuit is configured to perform differencing on the first signal and the third signal to output the second signal.

In one embodiment, the sensing sub-circuit comprises a sensing unit, a reset transistor, a first transistor, a second transistor, a storage capacitor and an amplifying transistor, a first terminal of the sensing unit is connected to a first power supply terminal, and a second terminal of the sensing unit is connected to a first node;

a first terminal of the reset transistor is connected to a reset control terminal, a second terminal of the reset transistor is connected to a second power supply terminal, and a third terminal of the reset transistor is connected to the first node;

a first terminal of the first transistor is connected to a first control terminal, a second terminal of the first transistor is connected to the first node, and a third terminal of the first transistor is connected to a second node;

a first terminal of the storage capacitor is connected to the first power supply terminal, and a second terminal of the storage capacitor is connected to the second node;

a first terminal of the second transistor is connected to a second control terminal, a second terminal of the second transistor is connected to the second node, and a third terminal of the second transistor is connected to gate of the amplifying transistor; and one of source and drain of the amplifying transistor is connected to the second power supply terminal and the other of source and drain of the amplifying transistor is configured as an output terminal of the sensing sub-circuit and connected to the processing sub-circuit.

In one embodiment, the processing sub-circuit comprises a first storage branch circuit, a second storage branch circuit, and a de-noising branch circuit, the first storage branch circuit is configured to receive and store the first signal;

the second storage branch circuit is configured to receive and store the third signal;

the de-noising branch circuit is configured to perform differencing on the first signal and the third signal to output the second signal;

the first storage branch circuit comprises a third transistor, a first capacitor and a fourth transistor, a first terminal of the third transistor is connected to a third control terminal, a second terminal of the third transistor is connected to the output terminal of the sensing sub-circuit, a third terminal of the third transistor is connected to a third node, a first terminal of the first capacitor is connected to ground and a second terminal of the first capacitor is connected to the third node, a first terminal of the fourth transistor is connected to a fourth control terminal, a second terminal of the fourth transistor is connected to the third node, a third terminal of the fourth transistor is configured as an output terminal of the first storage branch circuit and connected to the de-noising branch circuit;

the second storage branch circuit comprises a fifth transistor, a second capacitor and a sixth transistor, a first terminal of the fifth transistor is connected to a fifth control terminal, a second terminal of the fifth transistor is connected to the output terminal of the sensing sub-circuit, a third terminal of the fifth transistor is connected to a fourth node, a first terminal of the second capacitor is connected to the ground and a second terminal of the second capacitor is connected to the fourth node, a first terminal of the sixth transistor is connected to a sixth control terminal, a second terminal of the sixth transistor is connected to the fourth node, and a third terminal of the sixth transistor is configured as an output terminal of the second storage branch circuit and connected to the de-noising branch circuit; and the de-noising branch circuit comprises a comparing capacitor, a seventh transistor and an eighth transistor, a first terminal of the comparing capacitor is connected to the output terminal of the first storage branch circuit and a second terminal of the comparing capacitor is connected to the output terminal of the second storage branch circuit, a first terminal of the seventh transistor is connected to a seventh control terminal, a second terminal of the seventh transistor is connected to the ground, and a third terminal of the seventh transistor is connected to the second terminal of the comparing capacitor, a first terminal of the eighth transistor is connected to an eighth control terminal, a second terminal of the eighth transistor is connected to the first terminal of the comparing capacitor, and a third terminal of the eighth transistor is configured as an output terminal of the de-noising branch circuit.

In one embodiment, a capacitance of the storage capacitor is 5 PF to 15 PF.

In one embodiment, the sensing unit comprises a photodiode.

In one embodiment, the feature structure comprises a fingerprint.

In a second aspect, the present disclosure provides a detection system, comprising sequentially arranged at least two detection circuits described above and a plurality of comparing circuits, two adjacent detection circuits correspond to one comparing circuit, and output terminals of the two adjacent detection circuits are respectively connected to two input terminals of corresponding comparing circuit, so that in a comparing stage, each comparing circuit compares outputs of two detection circuits connected to the comparing circuit to determine variation tendency of the feature structure detected by the two adjacent detection circuits.

In a third aspect, the present disclosure provides a method for recognizing structural features based on the detection circuit described above, comprising the following steps:

in a first sampling stage, the sensing sub-circuit outputs a first signal containing only the noise information of the sensing sub-circuit to the processing sub-circuit;

in an exposure stage, the sensing sub-circuit senses the feature structure to be recognized, to obtain a second signal containing the information of the feature structure to be recognized, which is sensed by the sensing sub-circuit;

in a second sampling stage, the sensing sub-circuit outputs a third signal, containing the first signal and the second signal, to the processing sub-circuit; and in a de-noising stage, the processing sub-circuit performs differencing on the first signal and the third signal to output the second signal.

In one embodiment, in the first sampling stage, the reset transistor, the first transistor, the second transistor are turned on, and the amplifying transistor is turned on, so that the sensing sub-circuit outputs a first signal containing only the noise information of the sensing sub-circuit to the processing sub-circuit;

in the exposure stage, the reset transistor, the first transistor and the second transistor are turned off so that the sensing unit senses the feature structure to obtain a second signal; and in the second sampling stage, the first transistor is turned on and the second transistor is turned off, after the second signal obtained by the sensing unit is transferred to the storage capacitor, the first transistor is turned off, the second transistor is turned on and the amplifying transistor is turned on so that the sensing sub-circuit outputs a third signal comprising the first signal and the second signal to the processing sub-circuit.

In one embodiment, in the first sampling stage, the third transistor is turned on, and the first capacitor stores the first signal;

in the second sampling stage, the fifth transistor is turned on, and the second capacitor stores the third signal;

in the de-noising stage, the fourth transistor and the sixth transistor are turned on so that voltage difference between the first terminal and second terminal of the comparing capacitor is the second signal, the fourth transistor and the sixth transistor are turned off and the seventh transistor is turned on, so that voltage information of the first terminal of the comparing capacitor is maintained as the second signal, the seventh transistor is turned off and the eighth transistor is turned on, so that the third terminal of the eighth transistor outputs the second signal.

In a fourth aspect, the present disclosure provides a method for recognizing structural features based on the detection system described above, comprising the following steps:

in a first sampling stage, the sensing sub-circuit of each of the detection circuits outputs a first signal containing only the noise information of the sensing sub-circuit to the processing sub-circuit of the corresponding detection circuit;

in an exposure stage, the sensing sub-circuit of each of the detection circuits senses the corresponding feature structure to be recognized, to obtain a second signal containing the information of the feature structure to be recognized, which is sensed by the sensing sub-circuit;

in a second sampling stage, the sensing sub-circuit of each of the detection circuits outputs a third signal, containing the first signal and the second signal, to the processing sub-circuit of the corresponding detection circuit;

in a de-noising stage, the processing sub-circuit of each of the detection circuits performs differencing on the received first signal and third signal to output the second signal obtained by the sensing sub-circuit of the corresponding detection circuit; and in a comparing stage, each comparing circuit respectively compares the outputs of two adjacent detection circuits connected to the comparing circuit to determine the variation tendency of the feature structure detected by the two adjacent detection circuits.

In a fifth aspect, the present disclosure provides an organic light emitting diode display substrate, comprising a detection circuit above described.

In one embodiment, the organic light emitting diode display substrate comprises a plurality of pixel units, and one of the detection circuits is provided in each pixel unit.

In one embodiment, the organic light emitting diode display substrate comprises a substrate and an organic light emitting layer provided on the substrate, the detection circuit is provided between the substrate and the organic light emitting layer, and the display substrate is a display substrate of a bottom emission type organic light emitting diode.

In a sixth aspect, the present disclosure provides an organic light emitting diode display substrate, comprising a detection system described above.

In one embodiment, the organic light emitting diode display substrate comprises a plurality of pixel units, and one of the detection circuits is provided in each pixel unit;

two adjacent detection circuits correspond to a comparing circuit;

output terminals of the two adjacent detection circuits are respectively connected to two input terminals of the corresponding comparing circuit so that each comparing circuit compares the outputs of the two detection circuits connected to the comparing circuit to determine variation tendency of the feature structure detected by the two adjacent detection circuits.

BRIEF DESCRIPTION OF THE DRAWINGS

In order to more clearly illustrate the technical solutions in embodiments of the present disclosure or the prior art, drawings to be used in the description of the embodiments or the prior art will be briefly introduced below. Apparently, the drawings in the following description are only for some embodiments of the present disclosure, and other drawings

DETAILED DESCRIPTION

In order to make the objective, technical solutions and advantages of the embodiments of the present disclosure to be more apparent, hereinafter, the embodiments of the present disclosure will be described in detail, in combination with the drawings. Apparently, the described embodiments are a part of embodiments of the present disclosure, not all embodiments. Based on embodiments of the present disclosure, all other embodiments obtained by those of ordinary skill in the art without making creative work are within the scope of the present disclosure.

The First Embodiment

Figure 1:
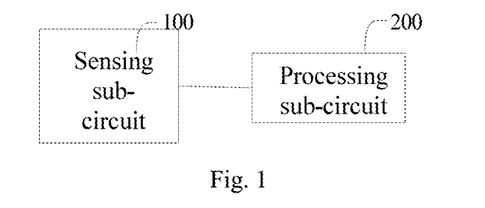
FIG. 1 is a structural schematic diagram of a detection circuit provided by a first embodiment of the present disclosure.

The first embodiment of the present disclosure provides a detection circuit for recognizing a feature structure to be recognized. Referring to FIG. 1, the detection circuit includes a sensing sub-circuit 100 and a processing sub-circuit 200.

In a first sampling stage, the sensing sub-circuit 100 is configured to output a first signal containing only the noise information of the sensing sub-circuit 100 to the processing sub-circuit 200.

In an exposure stage, the sensing sub-circuit 100 is configured to sense the feature structure to be recognized, to obtain a second signal containing the information of feature structure to be recognized, which is sensed by the sensing sub-circuit 100.

In a second sampling stage, the sensing sub-circuit 100 is configured to output a third signal, containing the first signal and the second signal, to the processing sub-circuit 200.

In a de-noising stage, the processing sub-circuit 200 is configured to perform differencing on the first signal and the third signal to output the second signal.

In the present embodiment, the feature structure may be a feature structure such as a fingerprint, a two-dimensional code, a bar code, or the like.

In the present embodiment, the noise information of the sensing sub-circuit 100 means that, in the features of the sensing sub-circuit 100 itself, the information that affects the feature structure sensed by the sensing sub-circuit 100. For example, it is assumed that the sensing sub-circuit 100 is comprised of a photodiode and an amplifying transistor TFT, due to the large difference between the leakage currents of the photodiode and the amplifying transistor TFT itself, some of the characteristics of the sensing sub-circuit 100 will greatly affect accurate recognition of the feature structure to be recognized.

The detection circuit provided by the present embodiment includes a sensing sub-circuit and a processing sub-circuit, wherein the sensing sub-circuit is used to sense the feature structure and the processing sub-circuit is used to remove the noise information of the sensing sub-circuit itself when the sensing sub-circuit is performing sensing, so that the entire detection circuit can accurately output the feature structure sensed by the sensing sub-circuit.

The Second Embodiment

Figure 2:
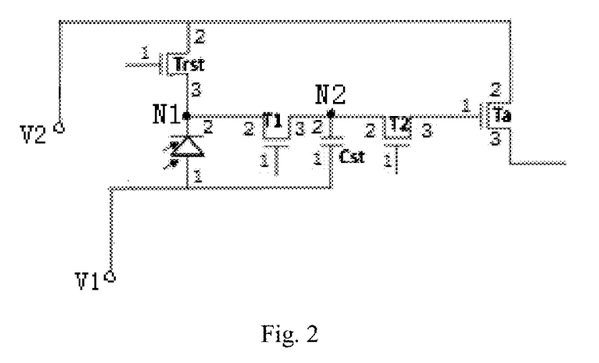
FIG. 2 is a circuit diagram of a sensing sub-circuit provided by a second embodiment of the present disclosure.

The second embodiment of the present disclosure provides a specific implementation structure of the sensing sub-circuit 100 mentioned in the above described first embodiment. Referring to FIG. 2, the present embodiment provides a sensing sub-circuit 100 including the flowing components:

a sensing unit, a reset transistor Trst, a first transistor T1, a second transistor T2, a storage capacitor Cst, and an amplifying transistor Ta. In one embodiment, the sensing unit in FIG. 2 is implemented as a photodiode. The present disclosure is not limited thereto, other photoelectric conversion devices can be used to implement the sensing unit. The amplifying transistor Ta is a field effect transistor operating in a linear region, and is used to amplify signals.

The first terminal of the sensing unit is connected to a first power supply terminal V1 and the second terminal of the sensing unit is connected to a first node N1. The reference numerals 1, 2 and 3 in FIGS. 2 to 4 denote the first terminal, the second terminal, the third terminal of each device, respectively.

The first terminal of the reset transistor Trst is connected to a reset control terminal, the second terminal of the reset transistor Trst is connected to a second power supply terminal V2, and the third terminal of the reset transistor Trst is connected to the first node N1.

The first terminal of the first transistor T1 is connected to a first control terminal, the second terminal of the first transistor T1 is connected to the first node N1, and the third terminal of the first transistor T1 is connected to a second node N2.

The first terminal of the storage capacitor Cst is connected to the first power supply terminal V1, and the second terminal of the storage capacitor Cst is connected to the second node N2.

The first terminal of the second transistor T2 is connected to the second control terminal, the second terminal of the second transistor T2 is connected to the second node N2, and the third terminal of the second transistor T2 is connected to the gate of the amplifying transistor Ta.

One of the source and the drain of the amplifying transistor Ta is connected to the second power supply terminal V2 and the other is used as an output terminal of the sensing sub-circuit 100 and connected to the processing sub-circuit 200.

Figure 5:
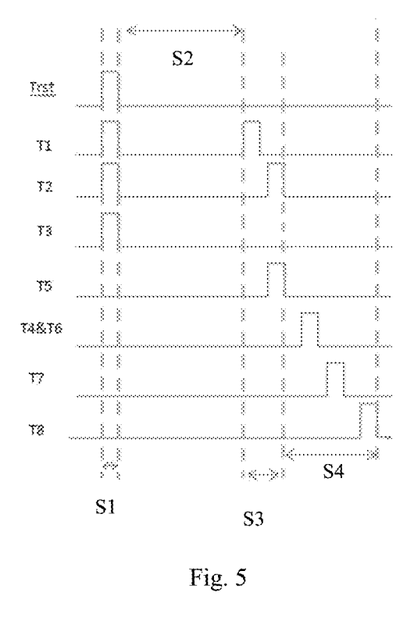
FIG. 5 is a timing sequence diagram of operation of the detection circuit shown in FIG. 4.

Referring to the timing sequence diagram shown in FIG. 5, in the first sampling stage, the reset transistor Trst, the first transistor T1, the second transistor T2 are turned on, and the amplifying transistor Ta is turned on, so that the sensing sub-circuit 100 outputs a first signal containing only the noise information of the sensing sub-circuit to the processing sub-circuit 200.

In the exposure stage, the reset transistor Trst, the first transistor T1 and the second transistor T2 are turned off so that the sensing unit senses the feature structure to obtain a second signal.

In the second sampling stage, the first transistor T1 is turned on and the second transistor T2 is turned off. After the second signal obtained by the sensing unit is transferred to the storage capacitor Cst, the first transistor T1 is turned off, the second transistor T2 is turned on and the amplifying transistor Ta is turned on, so that the sensing sub-circuit 100 outputs a third signal including the first signal and the second signal to the processing sub-circuit 200.

In order to realize the corresponding operation state of each of the above stages, it is necessary to control the reset control terminal, the first control terminal and the second control terminal respectively so that the reset transistor Trst, the first transistor T1 and the second transistor T2 are in the state of turning on or turning off at each stage.

In order to highlight the change in the potential of the storage capacitor Cst after charges are transferred, in one embodiment, the capacitance of the storage capacitor should be set to a smaller value, such as 5 PF to 15 PF.

As described above, the sensing sub-circuit provided by the present embodiment includes a sensing unit, a reset transistor Trst, a first transistor T1, a second transistor T2, a storage capacitor Cst, and an amplifying transistor Ta. In the first sampling stage, the reset transistor Trst, the first transistor T1, the second transistor T2 are turned on, and the amplifying transistor Ta is turned on, so that the sensing sub-circuit 100 outputs a first signal containing only the noise information of the sensing sub-circuit to the processing sub-circuit 200. In the exposure stage, the reset transistor Trst, the first transistor T1 and the second transistor T2 are turned off so that the sensing unit senses the feature structure to obtain a second signal. In the second sampling stage, the first transistor T1 is turned on and the second transistor T2 is turned off. After the second signal obtained by the sensing unit is transferred to the storage capacitor Cst, the first transistor T1 is turned off, the second transistor T2 is turned on and the amplifying transistor Ta is turned on so that the sensing sub-circuit 100 outputs a third signal including the first signal and the second signal to the processing sub-circuit 200. It can be seen that the sensing sub-circuit provided by the present embodiment realizes the output control of two signals, one signal is the noise information of the sensing sub-circuit and the other signal is the noise information of the sensing sub-circuit and the feature structure sensed by the sensing sub-circuit. In the following third embodiment, how to finally obtain the feature structure sensed by the sensing sub-circuit by the processing of the processing sub-circuit will be described.

The Third Embodiment

Figure 3:
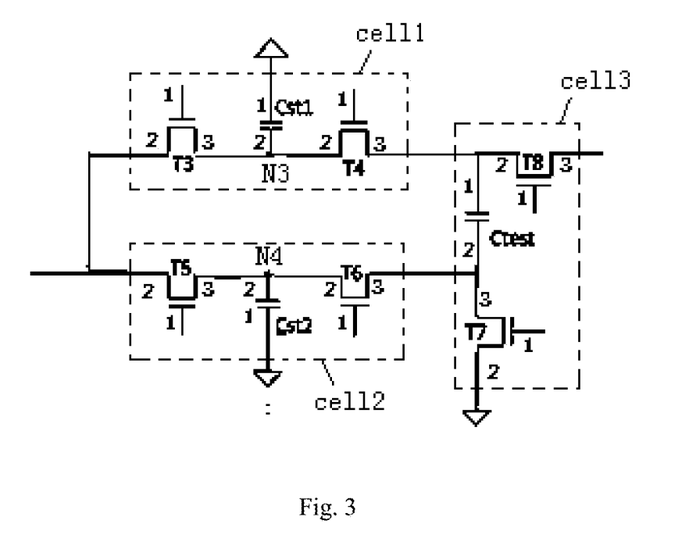
FIG. 3 is a circuit diagram of a processing sub-circuit provided by a third embodiment of the present disclosure.

On the basis of the above described first embodiment or second embodiment, the third embodiment of the present disclosure provides a specific implementation structure of the above described processing sub-circuit 200. As shown in FIG. 3, the processing sub-circuit 200 provided by the present embodiment includes a first storage branch circuit cell 1, a second storage branch circuit cell 2, and a de-noising branch circuit cell 3.

The first storage branch circuit cell 1 is configured to receive and store the first signal at the first sampling stage.

The second storage branch circuit cell 2 is configured to receive and store the third signal at the second sampling stage.

The de-noising branch circuit cell 3 is configured to perform differencing on the first signal and the third signal to output the second signal in the de-noising stage.

The processing sub-circuit 200 provided by the present embodiment includes three branch circuits, i.e., a first storage branch circuit cell 1, a second storage branch circuit cell 2, and a de-noising branch circuit cell 3. The first storage branch circuit cell 1 is configured to store the noise information of the sensing sub-circuit 100. The second storage branch circuit cell 2 is configured to store the noise information of the sensing sub-circuit 100 and the feature structure sensed by the sensing sub-circuit 100. The de-noising branch circuit cell 3 is configured to obtain the feature structure sensed by the sensing sub-circuit 100 by performing differencing. Thus the purpose of removing the inherent noise of the sensing sub-circuit 100 is achieved. Since the processing sub-circuit 200 removes the inherent noise of the sensing sub-circuit 100, the detection circuit described in the present embodiment can improve the accuracy of the feature recognition.

Further, the present embodiment also provides specific implementation structures of the first storage branch circuit cell 1, the second storage branch circuit cell 2, and the de-noising branch circuit cell 3.

The first storage branch circuit cell 1 includes a third transistor T3, a first capacitor Cst1 and a fourth transistor T4. The first terminal of the third transistor T3 is connected to a third control terminal, a second terminal of the third transistor T3 is connected to the output terminal of the sensing sub-circuit, the third terminal of the third transistor T3 is connected to the third node N3. The first terminal of the first capacitor Cst1 is connected to the ground and the second terminal of the first capacitor Cst1 is connected to the third node N3. The first terminal of the fourth transistor T4 is connected to the fourth control terminal, the second terminal of the fourth transistor T4 is connected to the third node N3, and the third terminal of the fourth transistor T4 is configured as the output terminal of the first storage branch circuit cell 1 and connected to the de-noising branch circuit cell 3.

The second storage branch circuit cell 2 includes a fifth transistor T5, a second capacitor Cst2 and a sixth transistor T6. The first terminal of the fifth transistor T5 is connected to a fifth control terminal, a second terminal of the fifth transistor T5 is connected to the output terminal of the sensing sub-circuit, the third terminal of the fifth transistor T5 is connected to the fourth node N4. The first terminal of the second capacitor Cst2 is connected to the ground and the second terminal of the second capacitor Cst2 is connected to the fourth node N4. The first terminal of the sixth transistor T6 is connected to the sixth control terminal, the second terminal of the sixth transistor T6 is connected to the fourth node N4, and the third terminal of the sixth transistor T6 is used as the output terminal of the second storage branch circuit cell 2 and connected to the de-noising branch circuit cell 3.

The de-noising branch circuit cell 3 includes a comparing capacitor Ctest, a seventh transistor T7 and an eighth transistor T8. The first terminal of the comparing capacitor Ctest is connected to the output terminal of the first storage branch circuit cell 1 and the second terminal of the comparing capacitor Ctest is connected to the output terminal of the second storage branch circuit cell 2. The first terminal of the seventh transistor T7 is connected to the seventh control terminal, the second terminal of the seventh transistor T7 is connected to the ground, and the third terminal of the seventh transistor T7 is connected to the second terminal of the comparing capacitor Ctest. The first terminal of the eighth transistor T8 is connected to the eighth control terminal, the second terminal of the eighth transistor T8 is connected to the first terminal of the comparing capacitor Ctest, and the third terminal of the eighth transistor T8 is used as the output terminal of the de-noising branch circuit cell 3.

In the first sampling stage, the third transistor is turned on, and the first capacitor stores the first signal.

In the second sampling stage, the fifth transistor is turned on, and the second capacitor stores the third signal.

In the de-noising stage, the fourth transistor and the sixth transistor are turned on so that the voltage difference between the first terminal and second terminal of the comparing capacitor is the second signal. The fourth transistor and the sixth transistor are turned off and the seventh transistor is turned on, so that the voltage information of the first terminal of the comparing capacitor Ctest is maintained as the second signal due to the bootstrap effect of the comparing capacitor Ctest. The seventh transistor is turned off and the eighth transistor is turned on, so that the third terminal of the eighth transistor outputs the second signal.

As described above, the processing sub-circuit provided by the present embodiment includes a first storage branch circuit cell 1, a second storage branch circuit cell 2, and a de-noising branch circuit cell 3. The first storage branch circuit cell 1 includes a third transistor T3, a first capacitor Cst1 and a fourth transistor T4. The second storage branch circuit cell 2 includes a fifth transistor T5, a second capacitor Cst2 and a sixth transistor T6. The de-noising branch circuit cell 3 includes a comparing capacitor Ctest, a seventh transistor T7 and an eighth transistor T8. Specially, in the first sampling stage, the third transistor is turned on, and the first storage branch circuit cell 1 receives the first signal. In the second sampling stage, the fifth transistor is turned on, and the second storage branch circuit cell 2 receives the third signal. In the de-noising stage, the fourth transistor and the sixth transistor are turned on so that the voltage difference between the first terminal and second terminal of the comparing capacitor is the second signal; the fourth transistor and the sixth transistor are turned off so that the seventh transistor is turned on, and the voltage information of the first terminal of the comparing capacitor is maintained as the second signal; the seventh transistor is turned off and the eighth transistor is turned on so that third terminal of said eighth transistor outputs the second signal. It can be seen that the present embodiment realizes the elimination of the inherent noise of the sensing sub-circuit through the first storage branch circuit cell 1, the second storage branch circuit cell 2, and the de-noising branch circuit cell 3, so that the detection circuit can recognize a more accurate feature structure to be recognized.

Figure 4:
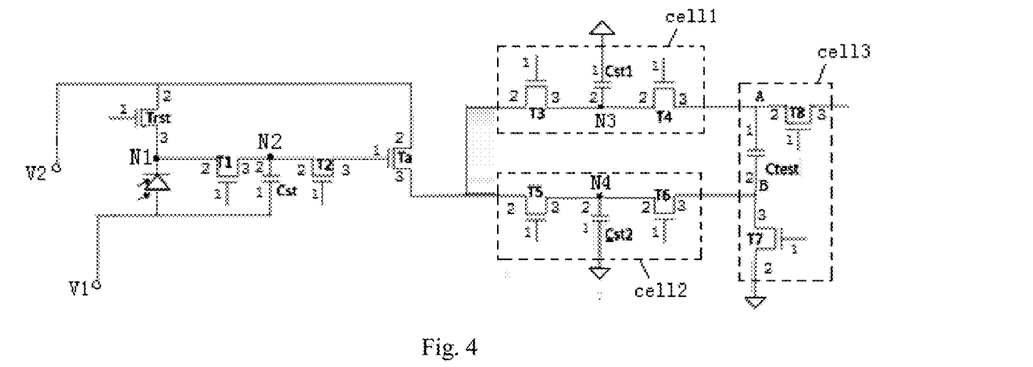
FIG. 4 is a circuit diagram of a detection circuit provided by a third embodiment of the present disclosure.

FIG. 4 shows a detection circuit composed of the sensing sub-circuit 100 shown in FIG. 2 and the processing sub-circuit 200 shown in FIG. 3. FIG. 5 is a timing sequence diagram of operation of the detection circuit shown in FIG. 4.

First, it is assumed that the sensing unit in the sensing sub-circuit is a photodiode, and the feature structure is a fingerprint.

The first power supply terminal V1 is Vss, and the second power supply terminal V2 is VDD. When the reflected light from the fingerprint patterns (such as the valley or the ridge) of the fingerprint is irradiated onto the photodiode, the exposure has actually occurred. However, since the switching transistors in the detection circuit are in the off state, the exposure at this time is actually pointless. First, the transistors Trst, T1 are both turned on, to reversely bias and reset the photodiode, and to reset the storage capacitor Cst, the transistor Ta is an field effect transistor working in the linear region and is to amplify signals, while the transistors T2, T3 are turned on to charge the capacitor Cts1, this process is the first sampling stage. In the first sampling stage S1, the sampling value is the signal after the VDD signal passes through the transistors T1, T2, T3 and Ta. Then, for the exposure stage S2, all the transistors TFTs are turned off and the photodiode is photographed. In this process, the concentration of the photogenerated carriers is different due to the different intensities of the reflected light of the fingerprint, and the node N1 point potential begins to decrease. The higher the light intensity, the more the potential of the node N1 drops.

The second sampling stage S3 and the de-noising stage S4 are followed. The transistor T1 actives and transfers the charges stored in the photodiode to the storage capacitor Cst. The capacitance of the storage capacitor Cst can be designed to be small, thereby the change in the potential of the storage capacitor Cst after the charges are transferred can be highlighted. After the transistor T1 is turned off, the transistors T2, T5 are turned on, the transistor Ta starts sampling. As the potential of the node N1 drops after exposure, the current flowing through the transistor Ta is reduced, charges stored in the second capacitor Cst2 are reduced (compared to the first capacitor Cst1). This sampling process takes the signal containing the fingerprint information. Then, the transistors T2 & T5 are turned off, and the transistors T4 & T6 are turned on (where T6 can be removed). The capacitors Cst1 and Cst2 charge the comparing capacitor Ctest at the same time. Since the potential of the capacitor Cst1 is higher than that of the capacitor Cst2, the potential of the point A is higher than that of the point B, and the difference is proportional to the fingerprint information. The larger difference indicates that the intensity of light received by the photodiode is greater, and the feature amount of the fingerprint pattern at the position corresponding to the detection circuit is greater, on the contrary, the feature amount of the fingerprint pattern at the position corresponding to the detection circuit is smaller. Since the first sampling stage S1 and the second sampling stage S3 both contain the inherent information of the transistors T1, T2, T3 and Ta, this inherent information is eliminated during the subtraction process, that is, the inherent noise is eliminated. Especially for the transistor Ta operating in the linear region, its homogeneity is difficult to be ensured, and the difference of the transistor Ta will be removed by the de-noising process. And then all the TFTs are turned off, the transistor T7 is turned on, the potential of the point A is the difference between the first sampling and the second sampling, and then the transistor T8 is turned on, the difference signal (that is, the feature structure sensed by the photodiode) is outputted through the third terminal of the transistor T8.

The Fourth Embodiment

As described above, it can be seen that the detection circuit described in the above embodiments can only recognize the feature amount of the fingerprint pattern at the position corresponding to the detection circuit and cannot directly determine the specific shape of the fingerprint pattern of the fingerprint. In order to solve the problem, the fourth embodiment provides a detection system comprising at least two detection circuits sequentially arranged, the detection circuit being any one of the above embodiments, and a plurality of comparing circuits A1.

Figure 6:
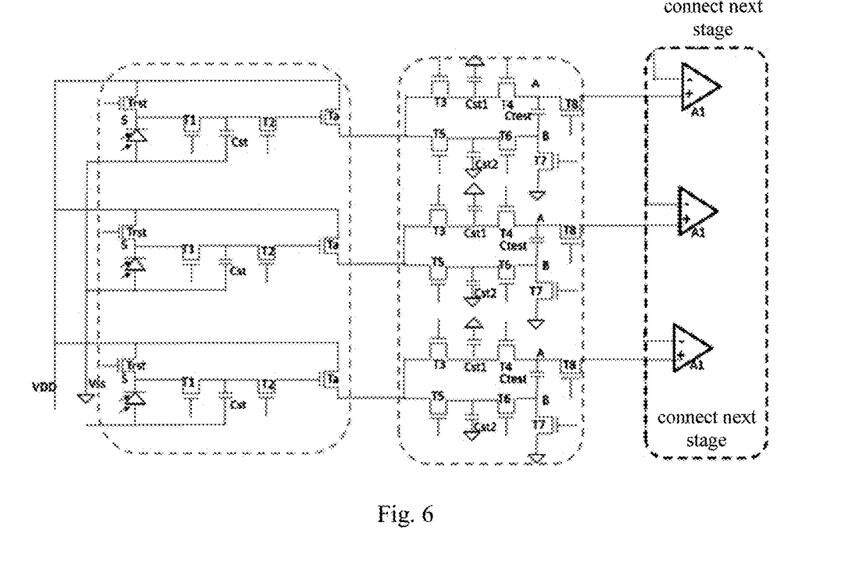
FIG. 6 is a circuit diagram of a detection system provided by a fourth embodiment of the present disclosure.

The two adjacent detection circuits correspond to a comparing circuit A1, and the output terminals of the two adjacent detection circuits are respectively connected to two input terminals of the corresponding comparing circuit A1 so that each comparing circuit A1 compares the output of the two detection circuits connected to the comparing circuit A1 to determine the variation tendency of the feature structure detected by the two adjacent detection circuits.

Referring to FIG. 6, the two adjacent detection circuits input the detected feature structure to the comparing circuit A1, and the comparing circuit A1 compares the two input signals input thereto to determine the variation tendency of the feature structure detected by the two adjacent detection circuits. For example, it is assumed that the two detection circuits connected to a certain comparing circuit A1 are the first detection circuit and the second detection circuit, respectively. After comparing the outputs of the two detection circuits, the comparing circuit A1 determines the information recognized by the first detection circuit is less than the information recognized by the second detection circuit. It is assumed that, for fingerprint recognition, the feature structure corresponding to the second detection circuit is an upward tendency with respect to the feature structure corresponding to the first detection circuit, that is, the feature structure corresponding to the second detection circuit is considered as a valley with respect to the feature structure corresponding to the first detection circuit. After the comparing circuit determines the variation tendency of the feature structure detected by the two adjacent detection circuits, and outputs the variation tendency, and then the analog-to-digital conversion is performed on to obtain specific shape of the fingerprint pattern.

The Fifth Embodiment

Figure 7:
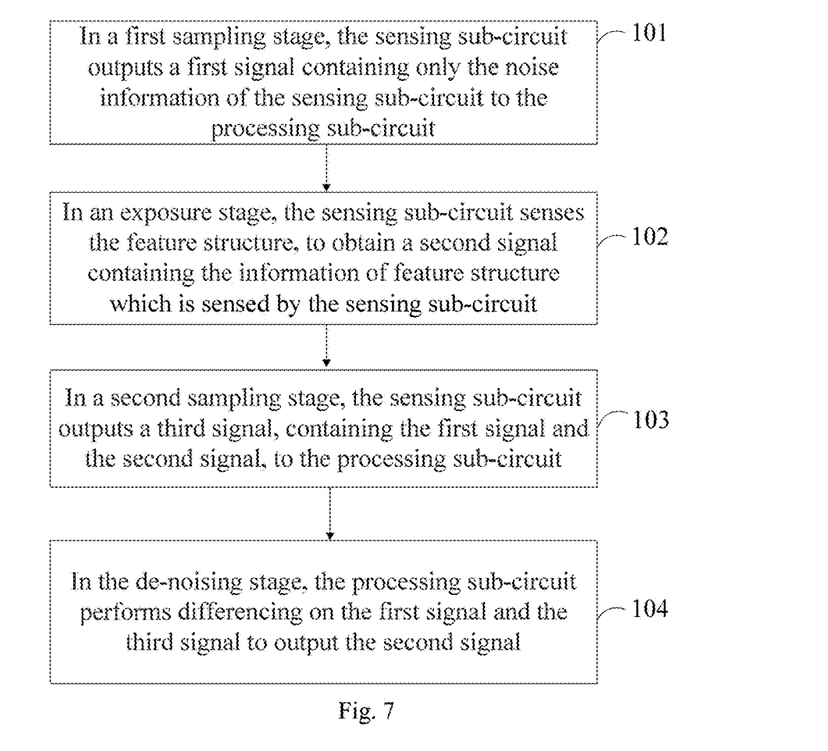
FIG. 7 is a flow chart of a method for recognizing structural features provided by a fifth embodiment of the present disclosure.

The fifth embodiment of the present disclosure provides a method for recognizing a structural feature of a detection circuit according to any one of the above embodiments. Referring to FIG. 7, the method includes the following steps.

At step 101, in a first sampling stage, the sensing sub-circuit outputs a first signal containing only the noise information of the sensing sub-circuit to the processing sub-circuit.

At step 102, in an exposure stage, the sensing sub-circuit senses the feature structure to be recognized, to obtain a second signal containing the information of the feature structure sensed by the sensing sub-circuit.

At step 103, in a second sampling stage, the sensing sub-circuit outputs a third signal, containing the first signal and the second signal, to the processing sub-circuit.

At step 104, in the de-noising stage, the processing sub-circuit performs differencing on the first signal and the third signal to output the second signal.

The method for recognizing a structural feature provided by the present embodiment is applied to the detection circuit described in any one of the above embodiments, and the specific operation principle and the advantageous effects thereof can refer to the descriptions in the above-described embodiments, and will not be described again.

Further, when the circuit structure of the sensing sub-circuit 100 of the detection circuit is as shown in FIG. 2 and the circuit structure of the processing sub-circuit 200 is as shown in FIG. 3 and the timing sequence diagram in FIG. 5 is referred to, the specific implementation process of the above described method for recognizing a structural feature based on the detection circuit is as follows.

In the first sampling stage, the reset transistor Trst, the first transistor T1, the second transistor T2 are turned on, and the amplifying transistor Ta and the third transistor are turned on, so that the sensing sub-circuit 100 outputs a first signal containing only the noise information of the sensing sub-circuit to the processing sub-circuit 200. The first storage branch circuit in the processing sub-circuit 200 receives and stores the first signal, that is, the third transistor is turned on, the first capacitor stores the first signal.

In the exposure stage, the reset transistor Trst, the first transistor T1 and the second transistor T2 are turned off so that the sensing unit senses the feature structure to obtain a second signal.

In the second sampling stage, the first transistor T1 is turned on and the second transistor T2 is turned off After the second signal obtained by the sensing unit is transferred to the storage capacitor Cst, the first transistor T1 is turned off, the second transistor T2 is turned on, and the fifth transistor T5 is turned on, the amplifying transistor Ta is turned on so that the sensing sub-circuit 100 outputs a third signal including the first signal and the second signal to the processing sub-circuit 200. The second storage branch circuit in the processing sub-circuit 200 receives and stores the third signal, that is, the fifth transistor is turned on, the second capacitor stores the third signal.

In the de-noising stage, the fourth transistor and the sixth transistor are turned on so that the voltage difference between the first terminal and second terminal of the comparing capacitor is as the second signal; the fourth transistor and the sixth transistor are turned off so that the seventh transistor is turned on, and the voltage information of the first terminal of the comparing capacitor is maintained as the second signal, the seventh transistor is turned off and the eighth transistor is turned on so that third terminal of said eighth transistor outputs the second signal. It can be seen that, finally, the processing sub-circuit 200 outputs a second signal, that is the feature structure sensed by the sensing sub-circuit 100, as the processing sub-circuit 200 eliminates the inherent noise of the sensing sub-circuit 100 (the first signal), so that the accuracy of recognizing feature can be improved by the method for recognizing a structural feature in the present embodiment.

The operation of each device of the entire detection circuit will be described in more detail with reference to FIGS. 4 and 5.

First, it is assumed that the sensing unit in the sensing sub-circuit is a photodiode, and the feature structure is a fingerprint.

The first power supply terminal V1 is Vss, and the second power supply terminal V2 is VDD. When the reflected light from the fingerprint patterns (such as the valley or the ridge) of the fingerprint is irradiated onto the photodiode, the exposure has actually occurred. However, since the switching transistors in the detection circuit are in the off state, the exposure at this time is actually pointless. First, the transistors Trst, T1 are both turned on, to reversely bias and reset the photodiode, and to reset the storage capacitor Cst, the transistor Ta is an field effect transistor working in the linear region and is to amplify signals, while the transistors T2, T3 are turned on to charge the capacitor Cts1, this process is the first sampling stage. In the first sampling stage, the sampling value is the signal after the VDD signal passes through the transistors T1, T2, T3 and Ta. Then, for the exposure stage, all the transistors TFTs are turned off and the photodiode is photographed. In this process, the concentration of the photogenerated carriers is different due to the different intensities of the reflected light of the fingerprint, and the node N1 point potential begins to decrease. The higher the light intensity, the more the potential of the node N1 drops.

The second sampling stage and the de-noising stage are followed. The transistor T1 actives and transfers the charges stored in the photodiode to the storage capacitor Cst. The capacitance of the storage capacitor Cst can be designed to be small, thereby the change in the potential of the storage capacitor Cst after the charges are transferred can be highlighted. After the transistor T1 is turned off, the transistors T2, T5 are turned on, the transistor Ta starts sampling. As the potential of the node N1 drops after exposure, the current flowing through the transistor Ta is reduced, charges stored in the second capacitor Cst2 are reduced (compared to the first capacitor Cst1). This sampling process takes the signal containing the fingerprint information. Then, the transistors T2 & T5 are turned off, and the transistors T4 & T6 are turned on (where T6 can be removed). The capacitors Cst1 and Cst2 charge the comparing capacitor Ctest at the same time. Since the potential of the capacitor Cst1 is higher than that of the capacitor Cst2, the potential of the point A is higher than that of the point B, and the difference is proportional to the fingerprint information. The larger difference indicates that the intensity of light received by the photodiode is greater, and the feature amount of the fingerprint pattern at the position corresponding to the detection circuit is greater, on the contrary, the feature amount of the fingerprint pattern at the position corresponding to the detection circuit is smaller. Since the first sampling stage and the second sampling stage both contain the inherent information of the transistors T1, T2, T3 and Ta, this inherent information is eliminated during the subtraction process, that is, the inherent noise is eliminated. Especially for the transistor Ta operating in the linear region, its homogeneity is difficult to be ensured, and the difference of the transistor Ta will be removed by the de-noising process. And then all the TFTs are turned off, the transistor T7 is turned on, the potential of the point A is the difference between the first sampling and the second sampling, and then the transistor T8 is turned on, the difference signal (that is, the feature structure sensed by the photodiode) is outputted through the third terminal of the transistor T8.

The Sixth Embodiment

Figure 8:
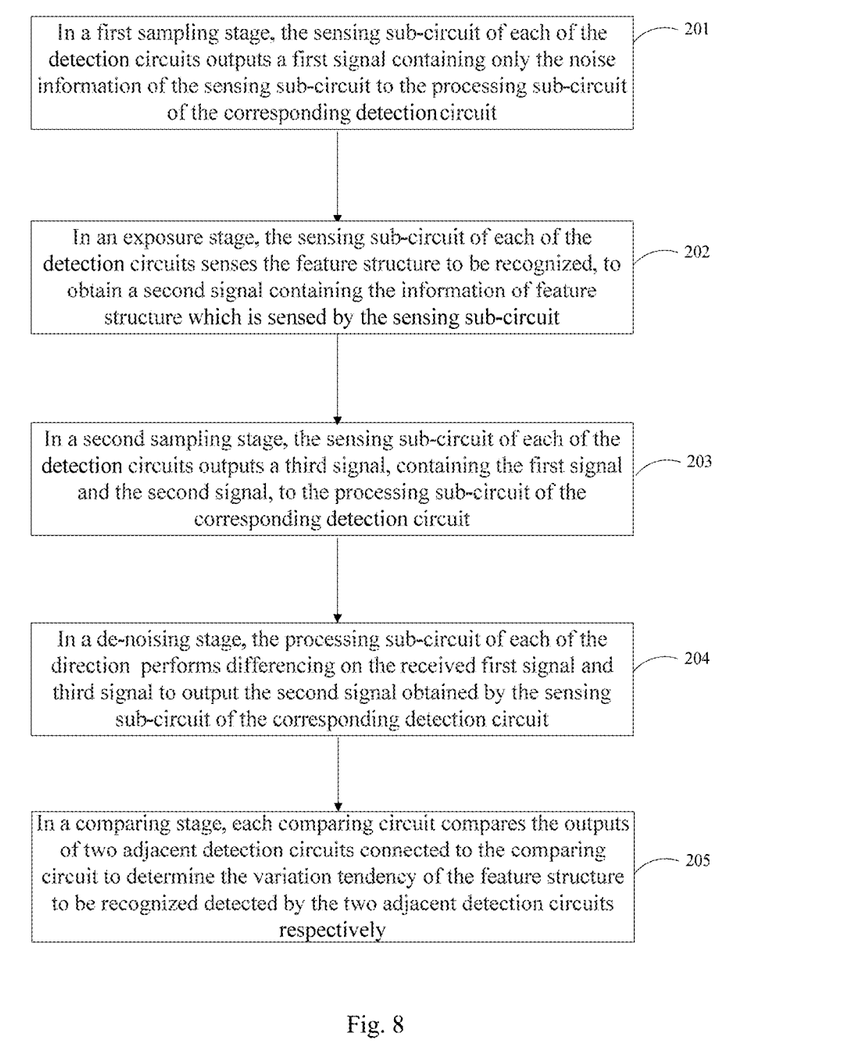
FIG. 8 is a flow chart of a method for recognizing structural features provided by a sixth embodiment of the present disclosure.

The sixth embodiment of the present disclosure provides a method for recognizing a structural feature of a detection system according to the above embodiments. Referring to FIG. 8, the method includes the following steps.

At step 201, in a first sampling stage, the sensing sub-circuit of each of the detection circuits outputs a first signal containing only the noise information of the sensing sub-circuit to the processing sub-circuit of the corresponding detection circuit.

At step 202, in an exposure stage, the sensing sub-circuit of each of the detection circuits senses the corresponding feature structure to be recognized, to obtain a second signal containing the information of the feature structure to be recognized, which is sensed by the sensing sub-circuit.

At step 203, in a second sampling stage, the sensing sub-circuit of each of the detection circuits outputs a third signal, containing the first signal and the second signal, to the processing sub-circuit of the corresponding detection circuit.

At step 204, in the de-noising stage, the processing sub-circuit of each of the detection circuits performs differencing on the received first signal and third signal to output the second signal obtained by the sensing sub-circuit of the corresponding detection circuit.

At step 205, in the comparing stage, each comparing circuit respectively compares the outputs of two adjacent detection circuits connected to the comparing circuit to determine the variation tendency of the feature structure detected by the two adjacent detection circuits.

In this step, after a plurality of comparing circuits are cascaded, it is possible to determine the overall line tendency of the feature structure to be recognized, such as the specific shape of the fingerprint pattern.

The specific embodiment of the first sampling stage, the exposure stage, the second sampling stage, and the de-noising stage of the detection circuit in the method for recognizing a structural feature in the present embodiment can refer to the description in the example of the fifth embodiment, and will not be described again. The method for recognizing a structural feature provided by the present embodiment uses the detection system in above described embodiments to perform the recognition, and the specific operation principle and the advantageous effects thereof can refer to the descriptions in the above-described embodiments, and will not be described again.

The Seventh Embodiment

The seventh embodiment of the present disclosure provides an organic light emitting diode display substrate including a detection circuit as described in any one of the above embodiments.

The organic light emitting diode display substrate includes a plurality of pixel units, and one detection circuit is provided in each pixel unit.

In one embodiment, the organic light emitting diode display substrate includes a substrate and an organic light emitting layer provided on the substrate, the detection circuit is provided between the substrate and the organic light emitting layer, and the display substrate is a display substrate of a bottom emission type organic light emitting diode.

Figure 9:
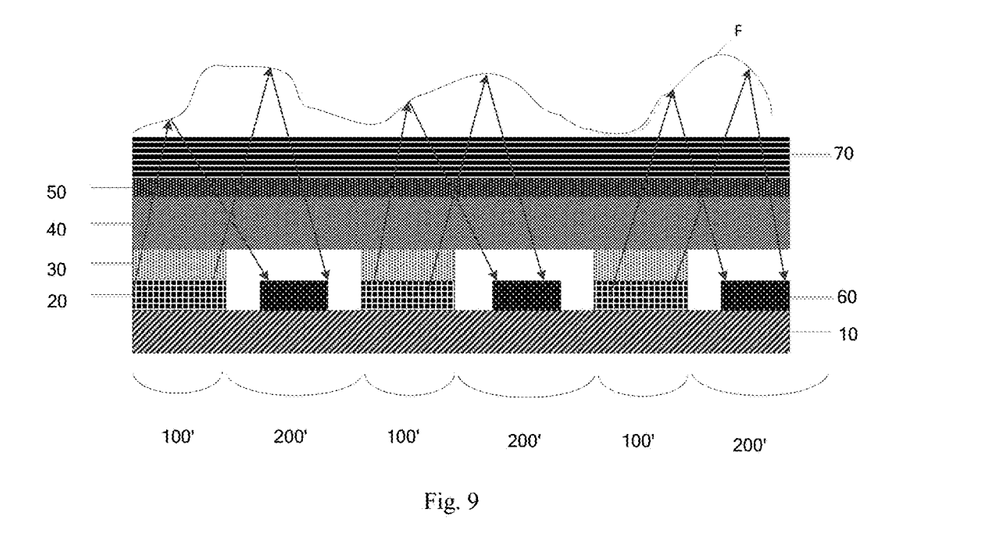
FIG. 9 is a structural schematic diagram of an organic light emitting diode display substrate provided by a seventh embodiment of the present disclosure.

Referring to FIG. 9, viewed from the cross section of the display substrate, the organic light emitting diode display substrate includes a substrate 10, an OLED (Organic Light Emitting Diode) pixel circuit 20, an anode 30, an organic light emitting layer 40, a cathode 50, and a cover plate 70 sequentially arranged. In one embodiment, the detection circuit 60 is disposed at a position in the same layer as the OLED pixel circuit 20. That is, the detection circuit 60 is provided between the substrate 10 and the organic light emitting layer 40.

Viewed in a horizontal direction, the organic light emitting diode display substrate includes a plurality of pixel circuit regions 100' for display and a plurality of recognition regions 200' for recognizing the feature structures to be recognized; wherein each of the recognition regions 200' is provided with a detection circuit 60. As can be seen from the drawings, the detection circuit 60 is provided between the substrate 10 and the organic light emitting layer 40, and the organic light emitting diode display substrate is a display substrate of a bottom emission type organic light emitting diode. In one embodiment, one recognition area is provided between the two adjacent pixel circuit regions. Referring to FIG. 9, where F is the feature structure to be recognized, the detection circuits provided in the organic light emitting diode display substrate are used to identify the feature structure at the position corresponding to the detection circuit, respectively.

The OLED display substrate provided in the present embodiment is provided with a detection circuit in the gap of the OLED pixel circuits. The organic light-emitting layer of the OLED display substrate is configured as a light source, the light passing through the texture of the feature structure is reflected into the photodiode in the detection circuit. As the intensity of the light reflected on different details structure (such as valley, ridge) of the feature structure is different, the concentration of the photogenerated carrier generated on the photodiode is different, thereby recognizing the feature structure to be recognized.

The Eighth Embodiment

The eighth embodiment provides an organic light emitting diode display substrate including a detection system as described in the above embodiment.

In one embodiment, the organic light emitting diode display substrate includes a plurality of pixel units, and one detection circuit is provided in each pixel unit.

The two adjacent detection circuits correspond to a comparing circuit.

The output terminals of the two adjacent detection circuits are respectively connected to two input terminals of the corresponding comparing circuit so that each comparing circuit compares the outputs of the two detection circuits connected to the comparing circuit to determine the variation tendency of the feature structure detected by the two adjacent detection circuits.

Figure 10:
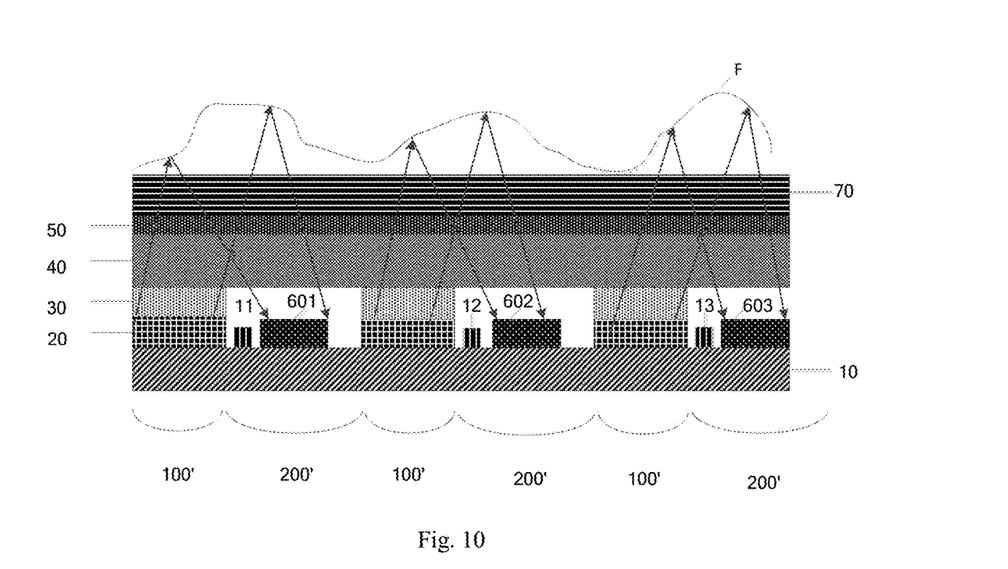
FIG. 10 is a structural schematic diagram of an organic light emitting diode display substrate provided by an eighth embodiment of the present disclosure.

Referring to FIG. 10, viewed in the vertical direction, the organic light emitting diode display substrate includes a substrate 10, an OLED (Organic Light Emitting Diode) pixel circuit 20, an anode 30, an organic light emitting layer 40, a cathode 50, and a cover plate 70 sequentially arranged. In one embodiment, the detection circuits 601, 602, 603 and the comparing circuits 11, 12 and 13 are disposed at positions in the same layer as the OLED pixel circuit 20.

Viewed in a horizontal direction, the organic light emitting diode display substrate includes a plurality of pixel circuit regions 100' for display and a plurality of recognition regions 200' for recognizing the feature structures to be recognized; wherein each of the recognition regions 200' is provided with a comparing circuit and a detection circuit (the initial recognition region need not to be provided with a comparing circuit). Wherein, the comparing circuit and the detection circuit are provided between the substrate 10 and the organic light emitting layer 40, and the organic light emitting diode display substrate is a display substrate of a bottom emission type organic light emitting diode. In one embodiment, one recognition area is provided between the two adjacent pixel circuit regions.

The two adjacent detection circuits correspond to a comparing circuit. Referring to FIG. 10, the detection circuit 601 and the detection circuit 602 which are adjacent correspond to a comparing circuit 12, and the detection circuit 602 and the detection circuit 603 which are adjacent correspond to a comparing circuit 13. Specifically, the output terminals of the two adjacent detection circuits are respectively connected to two input terminals of the corresponding comparing circuit so that each comparing circuit compares the outputs of the two detection circuits connected to the comparing circuit to determine the variation tendency of the feature structure detected by the two adjacent detection circuits. For example, for the feature structure F (e.g., fingerprint feature) as shown in FIG. 10, the comparing circuit can determine the variation tendency of the feature structure to be recognized, which is detected by the two adjacent detection circuits, thereby directly determining the shape information of the fingerprint lines.

The OLED display substrate provided in the present embodiment is provided with a comparing circuit and a detection circuit in the gap of the OLED pixel circuits. The organic light-emitting layer of the OLED display substrate is configured as a light source, the light passing through the texture of the feature structure is reflected into the photodiode in the detection circuit. As the intensity of the light reflected on different details structure (such as valley, ridge) of the feature structure is different, the concentration of the photogenerated carrier generated on the photodiode is different. Thus the detection circuit outputs a specific feature amount of the feature structure at the corresponding position of the detection circuit, and then the comparing circuit disposed between the two adjacent detection circuits compares the outputs of two adjacent detection circuits, so as to judge the variation tendency of the feature structure which is recognized by the two adjacent detection circuits, and can directly obtain the shape information of the feature structure to be recognized.

The above described embodiments are merely illustrative of the technical solutions of the disclosure and are not intended to limit thereof; although the disclosure has been described in detail with reference to the above described examples, it will be understood by those skilled in the art that the technical solutions in the above described embodiments can be modified, or some of the technical features therein can be replaced equivalently; and such modifications or replacements do not depart from the spirit and scope of the technical solutions of the various embodiments of the present disclosure.

What is claimed is:

1. A detection circuit for recognizing a feature structure, comprising a sensing sub-circuit and a processing sub-circuit;

the sensing sub-circuit comprises a sensing unit, a reset transistor, a first transistor, a second transistor, a storage capacitor and an amplifying transistor, a first terminal of the sensing unit is connected to a first power supply terminal, and a second terminal of the sensing unit is connected to a first node;

a first terminal of the reset transistor is connected to a reset control terminal, a second terminal of the reset transistor is connected to a second power supply terminal, and a third terminal of the reset transistor is connected to the first node;

a first terminal of the first transistor is connected to a first control terminal, a second terminal of the first transistor is connected to the first node, and a third terminal of the first transistor is connected to a second node;

a first terminal of the storage capacitor is connected to the first power supply terminal, and a second terminal of the storage capacitor is connected to the second node;

a first terminal of the second transistor is connected to a second control terminal, a second terminal of the second transistor is connected to the second node, and a third terminal of the second transistor is connected to gate of the amplifying transistor;

one of source and drain of the amplifying transistor is connected to the second power supply terminal and the other of source and drain of the amplifying transistor is configured as an output terminal of the sensing sub-circuit and connected to the processing sub-circuit; and wherein the sensing sub-circuit is configured to output a first signal containing only noise information of the sensing sub-circuit to the processing sub-circuit, and the sensing sub-circuit is also configured to sense the feature structure to obtain a second signal containing information of the feature structure and to output a third signal comprising a first signal and a second signal to the processing sub-circuit, and the processing sub-circuit is configured to perform differencing on the first signal and the third signal to output the second signal.

2. The detection circuit of claim 1, wherein the processing sub-circuit comprises a first storage branch circuit, a second storage branch circuit, and a de-noising branch circuit,
the first storage branch circuit is configured to receive and store the first signal;
the second storage branch circuit is configured to receive and store the third signal;
the de-noising branch circuit is configured to perform differencing on the first signal and the third signal to output the second signal;
the first storage branch circuit comprises a third transistor, a first capacitor and a fourth transistor, a first terminal of the third transistor is connected to a third control terminal, a second terminal of the third transistor is connected to an output terminal of the sensing sub-circuit, a third terminal of the third transistor is connected to a third node, a first terminal of the first capacitor is connected to ground and a second terminal of the first capacitor is connected to the third node, a first terminal of the fourth transistor is connected to a fourth control terminal, a second terminal of the fourth transistor is connected to the third node, a third terminal of the fourth transistor is configured as an output terminal of the first storage branch circuit and connected to the de-noising branch circuit;
the second storage branch circuit comprises a fifth transistor, a second capacitor and a sixth transistor, a first terminal of the fifth transistor is connected to a fifth control terminal, a second terminal of the fifth transistor is connected to the output terminal of the sensing sub-circuit, a third terminal of the fifth transistor is connected to a fourth node, a first terminal of the second capacitor is connected to the ground and a second terminal of the second capacitor is connected to the fourth node, a first terminal of the sixth transistor is connected to a sixth control terminal, a second terminal of the sixth transistor is connected to the fourth node, and a third terminal of the sixth transistor is configured as an output terminal of the second storage branch circuit and connected to the de-noising branch circuit; and
the de-noising branch circuit comprises a comparing capacitor, a seventh transistor and an eighth transistor, a first terminal of the comparing capacitor is connected to the output terminal of the first storage branch circuit and a second terminal of the comparing capacitor is connected to the output terminal of the second storage branch circuit, a first terminal of the seventh transistor is connected to a seventh control terminal, a second terminal of the seventh transistor is connected to the ground, and a third terminal of the seventh transistor is connected to the second terminal of the comparing capacitor, a first terminal of the eighth transistor is connected to an eighth control terminal, a second terminal of the eighth transistor is connected to the first terminal of the comparing capacitor, and a third terminal of the eighth transistor is configured as an output terminal of the de-noising branch circuit.

3. The detection circuit of claim 1, wherein a capacitance of the storage capacitor is 5 PF to 15 PF.

4. The detection circuit of claim 1, wherein the sensing unit comprises a photodiode.

5. The detection circuit of claim 1, wherein the feature structure comprises a fingerprint.

6. A detection system, comprising at least two detection circuits of claim 1 sequentially arranged and a plurality of comparing circuits,
wherein, two adjacent detection circuits correspond to one comparing circuit, and output terminals of the two adjacent detection circuits are respectively connected to two input terminals of corresponding comparing circuit, in a way that in a comparing stage, each comparing circuit compares output of the two adjacent detection circuits connected to the comparing circuit with each other to determine variation tendency of the feature structure detected by the two adjacent detection circuits.

7. A method for recognizing structural features comprising:
providing a sensing sub-circuit which comprises a sensing unit, a reset transistor, a first transistor, a second transistor, a storage capacitor and an amplifying transistor, the sensing sub-circuit configured such that:
a first terminal of the sensing unit is connected to a first power supply terminal;
a second terminal of the sensing unit is connected to a first node;
a first terminal of the reset transistor connected to a reset control terminal;
a second terminal of the reset transistor is connected to a second power supply terminal, and a third terminal of the reset transistor is connected to the first node;
a first terminal of the first transistor is connected to a first control terminal, a second terminal of the first transistor is connected to the first node, and a third terminal of the first transistor is connected to a second node;
a first terminal of the storage capacitor is connected to the first power supply terminal, and a second terminal of the storage capacitor is connected to the second node;
a first terminal of the second transistor is connected to a second control terminal, a second terminal of the second transistor is connected to the second node, and a third terminal of the second transistor is connected to gate of the amplifying transistor; and
one of source and drain of the amplifying transistor is connected to the second power supply terminal and the other of source and drain of the amplifying transistor is configured as an output terminal of the sensing sub-circuit and connected to the processing sub-circuit;
configuring the first sampling stage such that the sensing sub-circuit outputs a first signal containing only the noise information of the sensing sub-circuit to the processing sub-circuit;
further configuring the sensing sub-circuit to:
sense the feature structure to obtain a second signal containing information of the feature structure and to output a third signal comprising the first signal and a second signal to the processing sub-circuit;
configuring the processing sub-circuit to perform differencing on the first signal and the third signal to produce the second signal;
configuring an exposure stage such that the sensing sub-circuit senses the feature structure to be recognized and produces a second signal containing the information of the feature structure to be recognized, which is sensed by the sensing sub-circuit;
configuring a second sampling stage such that the sensing sub-circuit outputs a third signal, containing the first signal and the second signal, to the processing sub-circuit; and in a de-noising stage, the processing sub-circuit performing differencing on the first signal and the third signal to output the second signal.

8. The method of claim 7, wherein,
in the first sampling stage, turning on the reset transistor, the first transistor, the second transistor, and turning on the amplifying transistor, in a way that the sensing sub-circuit outputs the first signal containing the noise information of the sensing sub-circuit to the processing sub-circuit;
in the exposure stage, turning off the reset transistor, the first transistor and the second transistor, in a way that the sensing unit senses the feature structure to obtain the second signal; and
in the second sampling stage, turning on the first transistor and turning off the second transistor, after transferring the second signal obtained by the sensing unit to the storage capacitor, turning off the first transistor, turning on the second transistor and turning on the amplifying transistor, in a way that the sensing sub-circuit outputs the third signal comprising the first signal and the second signal to the processing sub-circuit.

9. The method of claim 7, wherein the processing sub-circuit comprises a first storage branch circuit, a second storage branch circuit, and a de-noising branch circuit,
the first storage branch circuit is configured to receive and store the first signal;
the second storage branch circuit is configured to receive and store the third signal;
the de-noising branch circuit is configured to perform differencing on the first signal and the third signal to output the second signal;
configuring the first storage branch circuit such that it comprises a third transistor, a first capacitor and a fourth transistor, a first terminal of the third transistor is connected to a third control terminal, a second terminal of the third transistor is connected to an output terminal of the sensing sub-circuit, a third terminal of the third transistor is connected to a third node, a first terminal of the first capacitor is connected to ground and a second terminal of the first capacitor is connected to the third node, a first terminal of the fourth transistor is connected to a fourth control terminal, a second terminal of the fourth transistor is connected to the third node, a third terminal of the fourth transistor is configured as an output terminal of the first storage branch circuit and connected to the de-noising branch circuit;
configuring the second storage branch circuit such that it comprises a fifth transistor, a second capacitor and a sixth transistor, a first terminal of the fifth transistor is connected to a fifth control terminal, a second terminal of the fifth transistor is connected to the output terminal of the sensing sub-circuit, a third terminal of the fifth transistor is connected to a fourth node, a first terminal of the second capacitor is connected to the ground and a second terminal of the second capacitor is connected to the fourth node, a first terminal of the sixth transistor is connected to a sixth control terminal, a second terminal of the sixth transistor is connected to the fourth node, and a third terminal of the sixth transistor is configured as an output terminal of the second storage branch circuit and connected to the de-noising branch circuit; and
configuring the de-noising branch circuit such that it comprises a comparing capacitor, a seventh transistor and an eighth transistor, a first terminal of the comparing capacitor is connected to the output terminal of the first storage branch circuit and a second terminal of the comparing capacitor is connected to the output terminal of the second storage branch circuit, a first terminal of the seventh transistor is connected to a seventh control terminal, a second terminal of the seventh transistor is connected to the ground, and a third terminal of the seventh transistor is connected to the second terminal of the comparing capacitor, a first terminal of the eighth transistor is connected to an eighth control terminal, a second terminal of the eighth transistor is connected to the first terminal of the comparing capacitor, and a third terminal of the eighth transistor is configured as an output terminal of the de-noising branch circuit;
in the first sampling stage, turning on the third transistor, and the first capacitor storing the first signal;
in the second sampling stage, turning on the fifth transistor, and the second capacitor storing the third signal;
in the de-noising stage, turning on the fourth transistor and the sixth transistor, in this way, voltage difference between the first terminal and second terminal of the comparing capacitor is the second signal, turning off the fourth transistor and the sixth transistor and turning on the seventh transistor, in a way that voltage information of the first terminal of the comparing capacitor is maintained as the second signal, turning off the seventh transistor and turning on the eighth transistor, in a way that the third terminal of the eighth transistor outputs the second signal.

10. A method for recognizing structural features based on the detection system comprising at least two detection circuits of claim 1 sequentially arranged and a plurality of comparing circuits,
wherein, two adjacent detection circuits correspond to one comparing circuit, and output terminals of the two adjacent detection circuits are respectively connected to two input terminals of corresponding comparing circuit, in a way that in a comparing stage, each comparing circuit compares output of the two adjacent detection circuits connected to the comparing circuit with each other to determine variation tendency of the feature structure detected by the two adjacent detection circuits,
wherein the method comprises:
in a first sampling stage, the sensing sub-circuit of each of the detection circuits outputting a first signal containing only the noise information of the sensing sub-circuit to the processing sub-circuit of the corresponding detection circuit;
in an exposure stage, the sensing sub-circuit of each of the detection circuits sensing the corresponding feature structure to be recognized, to obtain a second signal containing the information of the feature structure to be recognized, which is sensed by the sensing sub-circuit;
in a second sampling stage, the sensing sub-circuit of each of the detection circuits outputting a third signal, containing the first signal and the second signal, to the processing sub-circuit of the corresponding detection circuit;
in a de-noising stage, the processing sub-circuit of each of the detection circuits performing differencing on the received first signal and third signal to output the second signal obtained by the sensing sub-circuit of the corresponding detection circuit; and
in a comparing stage, each comparing circuit respectively comparing the outputs of two adjacent detection circuits connected to the comparing circuit to determine the variation tendency of the feature structure detected by the two adjacent detection circuits.

11. An organic light emitting diode display substrate, comprising a detection circuit of claim 1.

12. The organic light emitting diode display substrate of claim 11, wherein the organic light emitting diode display substrate comprises a plurality of pixel units, and one of the detection circuits is provided in each pixel unit.

13. The organic light emitting diode display substrate of claim 11, wherein the organic light emitting diode display substrate comprises a substrate and an organic light emitting layer provided on the substrate, the detection circuit is provided between the substrate and the organic light emitting layer, and the display substrate is a display substrate of a bottom emission type organic light emitting diode.

14. An organic light emitting diode display substrate, comprising a detection system of claim 6.

15. The organic light emitting diode display substrate of claim 14, wherein the organic light emitting diode display substrate comprises a plurality of pixel units, and one of the detection circuits is provided in each pixel unit;
two adjacent detection circuits correspond to a comparing circuit;
output terminals of the two adjacent detection circuits are respectively connected to two input terminals of the corresponding comparing circuit, in a way that each comparing circuit compares the output of the two detection circuits connected to the comparing circuit to determine variation tendency of the feature structure detected by the two adjacent detection circuits.

16. The detection system of claim 6, wherein the sensing sub-circuit comprises a sensing unit, a reset transistor, a first transistor, a second transistor, a storage capacitor and an amplifying transistor, a first terminal of the sensing unit is connected to a first power supply terminal, and a second terminal of the sensing unit is connected to a first node;
a first terminal of the reset transistor is connected to a reset control terminal, a second terminal of the reset transistor is connected to a second power supply terminal, and a third terminal of the reset transistor is connected to the first node;
a first terminal of the first transistor is connected to a first control terminal, a second terminal of the first transistor is connected to the first node, and a third terminal of the first transistor is connected to a second node;
a first terminal of the storage capacitor is connected to the first power supply terminal, and a second terminal of the storage capacitor is connected to the second node;
a first terminal of the second transistor is connected to a second control terminal, a second terminal of the second transistor is connected to the second node, and a third terminal of the second transistor is connected to gate of the amplification transistor; and
one of source and drain of the amplifying transistor is connected to the second power supply terminal and the other of source and drain of the amplifying transistor is configured as an output terminal of the sensing sub-circuit and connected to the processing sub-circuit.

17. The organic light emitting diode display substrate of claim 11, wherein the sensing sub-circuit comprises a sensing unit, a reset transistor, a first transistor, a second transistor, a storage capacitor and an amplifying transistor, a first terminal of the sensing unit is connected to a first power supply terminal, and a second terminal of the sensing unit is connected to a first node;
a first terminal of the reset transistor is connected to a reset control terminal, a second terminal of the reset transistor is connected to a second power supply terminal, and a third terminal of the reset transistor is connected to the first node;
a first terminal of the first transistor is connected to a first control terminal, a second terminal of the first transistor is connected to the first node, and a third terminal of the first transistor is connected to a second node;
a first terminal of the storage capacitor is connected to the first power supply terminal, and a second terminal of the storage capacitor is connected to the second node;
a first terminal of the second transistor is connected to a second control terminal, a second terminal of the second transistor is connected to the second node, and a third terminal of the second transistor is connected to gate of the amplification transistor; and
one of source and drain of the amplifying transistor is connected to the second power supply terminal and the other of source and drain of the amplifying transistor is configured as an output terminal of the sensing sub-circuit and connected to the processing sub-circuit.

* * * * *